United States Patent
Kato et al.

(10) Patent No.: US 8,114,719 B2
(45) Date of Patent: Feb. 14, 2012

(54) MEMORY DEVICE AND MANUFACTURING METHOD OF THE SAME

(75) Inventors: Kiyoshi Kato, Isehara (JP); Tetsuji Yamaguchi, Toyokawa (JP); Etsuko Asano, Atsugi (JP); Konami Izumi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 678 days.

(21) Appl. No.: 10/573,527

(22) PCT Filed: May 31, 2005

(86) PCT No.: PCT/JP2005/010308
§ 371 (c)(1),
(2), (4) Date: Mar. 24, 2006

(87) PCT Pub. No.: WO2005/119779
PCT Pub. Date: Dec. 15, 2005

(65) Prior Publication Data
US 2008/0211024 A1 Sep. 4, 2008

(30) Foreign Application Priority Data

Jun. 3, 2004 (JP) ................................. 2004-166274
Sep. 16, 2004 (JP) ................................. 2004-270418

(51) Int. Cl.
*H01L 27/12* (2006.01)
*H01L 21/336* (2006.01)

(52) U.S. Cl. . 438/149; 257/209; 257/350; 257/E21.411; 257/E27.111; 257/E27.112; 438/157

(58) Field of Classification Search ............ 257/16, 257/49, 52, 59, 68, 770–72, 64–66, 347, 257/350, 208–209, 70–72, E21.411, E21.662, 257/E21.68, E27.112, E27.111, E27.103, 257/E27.102; 438/153, 166, 238–239, 478, 438/157, 149
See application file for complete search history.

(56) References Cited

U.S. PATENT DOCUMENTS 5,426,605 A 6/1995 Van Berkel et al.
(Continued)

FOREIGN PATENT DOCUMENTS

EP 0588402 A 3/1994
(Continued)

OTHER PUBLICATIONS

Tiemin Zhao, Min Cao, James D. Plummer, and Krishna C. Saraswat; A Novel Floating Gate Spacer Polysilicon TFT; Electron Devices Meeting, 1993. IEDM'93, technical Digest., International; pp. 393-396.*

(Continued)

*Primary Examiner* — A. Sefer
*Assistant Examiner* — Ermias Woldegeorgis
(74) *Attorney, Agent, or Firm* — Eric J. Robinson; Robinson Intellectual Property Law Office, P.C.

(57) ABSTRACT

An easy-to-use and inexpensive memory device is provided while maintaining product specifications and productivity even when a memory is formed on the same substrate as other functional circuits. The memory device of the invention includes a memory cell formed on an insulating surface. The memory cell includes a semiconductor film having two impurity regions, a gate electrode, and two wirings connected to the respective impurity regions. The two wirings are insulated from each other by applying a voltage between the gate electrode and at least one of the two wirings to alter the state of the semiconductor film.

12 Claims, 10 Drawing Sheets

U.S. PATENT DOCUMENTS

| | | | |
|---|---|---|---|
| 5,457,649 A * | 10/1995 | Eichman et al. | 365/174 |
| 5,798,534 A * | 8/1998 | Young | 257/59 |
| 5,854,494 A * | 12/1998 | Yamazaki et al. | 257/57 |
| 6,646,912 B2 | 11/2003 | Hurst et al. | |
| 6,650,143 B1 | 11/2003 | Peng | |
| 6,791,891 B1 | 9/2004 | Peng | |
| 2002/0126108 A1* | 9/2002 | Koyama et al. | 345/204 |
| 2003/0071296 A1 | 4/2003 | Peng | |
| 2003/0198085 A1 | 10/2003 | Peng | |
| 2003/0206467 A1 | 11/2003 | Peng et al. | |
| 2004/0031853 A1 | 2/2004 | Peng | |
| 2004/0047218 A1 | 3/2004 | Peng | |
| 2004/0125671 A1 | 7/2004 | Peng | |
| 2004/0156234 A1 | 8/2004 | Peng et al. | |
| 2004/0208055 A1 | 10/2004 | Wang et al. | |
| 2004/0223363 A1 | 11/2004 | Peng | |
| 2004/0223370 A1 | 11/2004 | Wang et al. | |
| 2005/0169039 A1 | 8/2005 | Peng | |
| 2005/0174845 A1* | 8/2005 | Koyama et al. | 365/185.04 |
| 2005/0184754 A1 | 8/2005 | Wang | |
| 2007/0091663 A1 | 4/2007 | Nakamura | |

FOREIGN PATENT DOCUMENTS

| | | |
|---|---|---|
| EP | 0724777 B | 12/1999 |
| JP | 56-044198 | 4/1981 |
| JP | 04-028249 | 1/1992 |
| JP | 04-373147 | 12/1992 |
| JP | 06-209092 A | 7/1994 |
| JP | 09-504657 | 5/1997 |
| JP | 11-040758 A | 2/1999 |
| JP | 2003-036684 | 2/2003 |
| WO | 9607300 | 3/1996 |
| WO | WO 96/07300 | 3/1996 |

OTHER PUBLICATIONS

International Search Report (Application No. PCT/JP2005/010308; PCT7930-8168) dated Sep. 13, 2005.

Written Opinion (Application No. PCT/JP2005/010308; PCT7930-8168) dated Sep. 13, 2005.

* cited by examiner

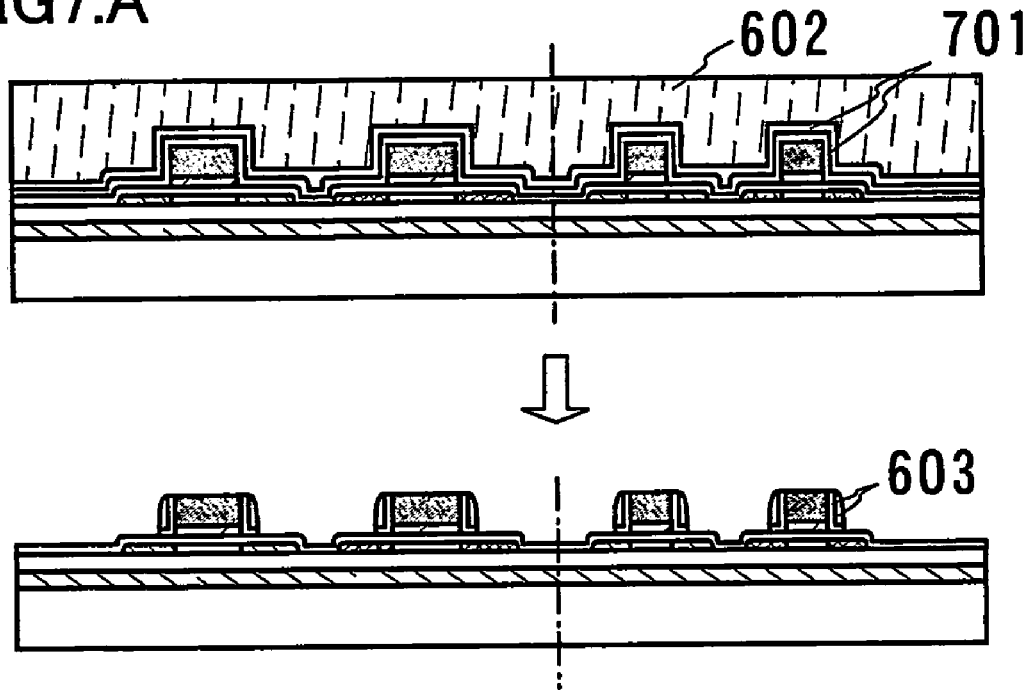
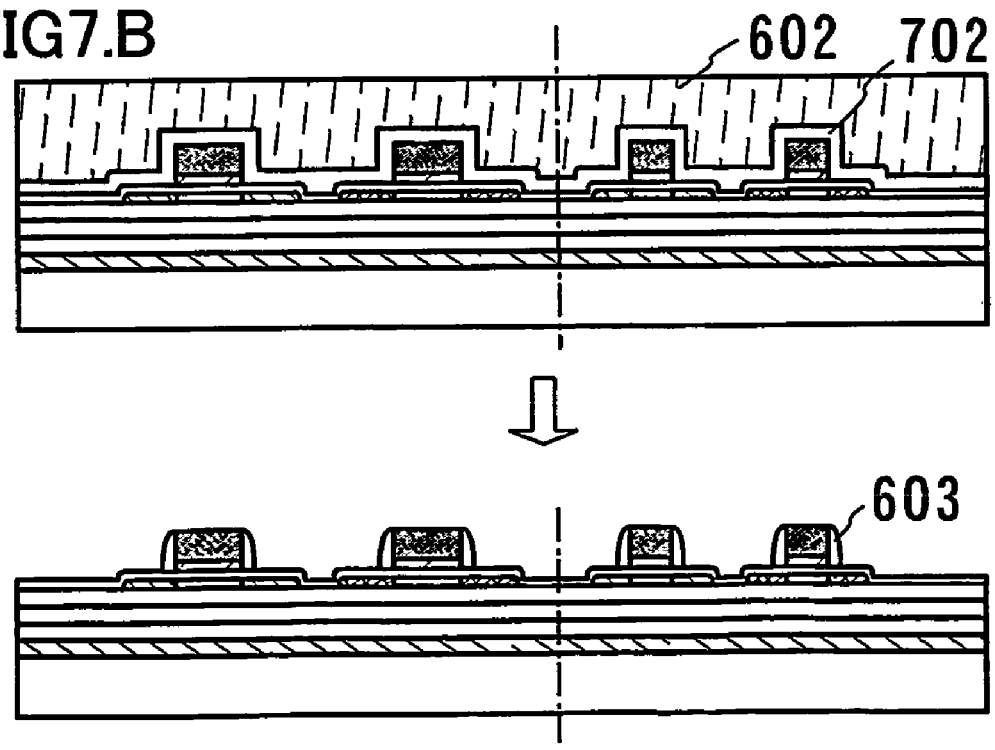

MEMORY DEVICE AND MANUFACTURING METHOD OF THE SAME

TECHNICAL FIELD

The present invention relates to a memory device, and more particularly to a nonvolatile memory device.

BACKGROUND ART

In modern society, many electronic appliances are used and various data is generated and employed, requiring a memory device to store the data. Various memory devices produced and used today each has different advantages and disadvantages, and is selected depending on the data to be stored and used.

For example, a volatile memory that loses its memory content when the power is turned off includes a DRAM and an SRAM. The volatile memory has limited applications because of the volatility; however, it is used as a main memory device or a cash memory of a computer taking advantage of a short access time. As each memory cell has a small size, a large-capacity DRAM can be produced easily, though it is controlled in a complex manner and consumes much power. Meanwhile, an SRAM includes a memory cell constituted by a CMOS and is easily manufactured and controlled, though a large-capacity SRAM is produced with difficulty since one memory cell needs six transistors.

A nonvolatile memory that holds its memory content even after the power is turned off includes: a rewritable memory where data can be rewritten many times; a write-once memory where data can be written by a user only once; and a mask ROM where data content is determined in the manufacture of the memory and cannot be rewritten thereafter. As the rewritable memory, there are an EPROM, a flash memory, a ferroelectric memory, and the like. The EPROM allows an easy writing of data and unit cost per bit is relatively low, though dedicated program device and eraser for writing and erasing are required. The flash memory and the ferroelectric memory allow rewriting on a substrate used, have a short access time, and consume low power, though manufacturing steps of a floating gate and a ferroelectric layer are required to increase unit cost per bit.

Each memory cell of a write-once memory is constituted by a fuse, an antifuse, a cross pointer diode, an OLED (Organic Light Emitting Diode), a bistable liquid crystal element, and other devices whose state is changed by heat or light. In general, a memory device stores data by selecting one of the two states of each memory cell. The write-once memory device is manufactured with all memory cells having a first state, and only memory cells specified by a writing operation are changed to a second state. The change from the first state to the second state is irreversible and the changed memory cell cannot be restored.

Manufacturing steps of a write-once memory have limited temperature and materials, thus it is not formed on a silicon substrate in many cases. That is, a write-once memory is manufactured in completely different steps than a central processing unit (hereinafter referred to as a CPU), an arithmetic circuit, a rectification circuit, a control circuit and the like (hereinafter collectively referred to as other functional circuits to be distinguished from a write-once memory), which are generally formed on a silicon substrate. For example, an antifuse write-once memory has a wiring, an antifuse layer, and a control element, which are formed on a plastic or metal substrate (see Patent Document 1). The memory device manufactured in this manner achieves low cost, large capacity, low power consumption, and short access time. In the case of forming a semiconductor device having a certain function, however, a memory does not operate by itself and other functional circuits are necessarily required. Therefore, it is necessary to form a memory such as a write-once memory and other functional circuits separately.

In recent years, an IC tag has been known as an example of a semiconductor device where a memory and other functional circuits are integrated on the same silicon substrate. An IC tag includes memories such as an SRAM, a mask ROM, a flash memory, and a ferroelectric memory. A mask ROM is a memory where data content is determined in the manufacture of the memory and cannot be rewritten by an IC tag user. In addition, a piece of data is determined by one photomask; therefore, the mask ROM requires as many photomasks as kinds of data. Thus, the mask ROM is not practical for cost reasons.

A flash memory and a ferroelectric memory require additional steps for forming a floating gate and a ferroelectric layer in a gate insulating film. Meanwhile, all the circuits other than the memory in an IC tag can be obtained by CMOS manufacturing steps.

In recent years, technologies for forming a thin film transistor (hereinafter referred to as a TFT) on an insulating substrate have been actively developed to manufacture a display device such as a liquid crystal display and an EL display. For example, a driver circuit for displaying images and a pixel portion are formed on the same substrate using TFTs. Since an insulating substrate is not capacitively coupled to a wiring, high speed operation of a circuit can be achieved. Accordingly, various functional circuits such as an arithmetic circuit and a memory circuit are proposed to be formed using TFTs. Another advantage of forming functional circuits on an insulating substrate is cost saving. A glass substrate and a plastic substrate are quite inexpensive as compared to a silicon substrate. Further, it is possible to use an insulating substrate with a larger area than a silicon substrate that is limited to a small area. Thus, the number of products manufactured on an insulating substrate increases than that manufactured on a silicon substrate, leading to a very inexpensive semiconductor device.

A memory device formed using TFT manufacturing technologies includes a mask ROM, an SRAM, and a flash memory. An SRAM including TFTs can be easily formed on the same substrate as other functional circuits, though it has limited applications because of the volatility. A mask ROM is not practical since different photomasks are required for different data. A flash memory requires additional steps for forming a floating gate, though other functional circuits such as an arithmetic circuit on an insulating substrate can be formed by TFT manufacturing steps.

As set forth above, the invention is made in view of the two technologies: a technology for forming a memory device and a technology for forming a circuit on an insulating substrate such as a glass substrate or an insulating surface.

Patent Document 1

Japanese Patent Laid-Open No. 2003-36684

DISCLOSURE OF INVENTION

It is difficult to form a nonvolatile memory and other functional circuits on the same substrate with conventional technologies, regardless of whether a semiconductor integrated circuit is formed on a silicon substrate or an insulating substrate. However, when a memory and other functional circuits are formed separately to obtain one device, they are required to be connected externally, which results in increased size of a completed device. In addition, at least two circuits that are a memory and other functional circuits are expensive to manufacture. Even when a memory and other functional circuits can be formed on the same substrate as a flash memory and a ferroelectric memory, additional steps are required to form the memory. In the manufacture of a semiconductor device, increase in manufacturing steps leads to high cost, limits product specifications, and decreases productivity.

In other words, almost all memory devices manufactured with conventional technologies require specific steps. Accordingly, they cannot be formed on the same substrate as other functional circuits or they require additional steps other than TFT manufacturing steps even when formed on the same substrate as other functional circuits. Such a problem leads to extra cost for a memory in the manufacture of a semiconductor device having a function, for example such as an IC tag.

In view of the foregoing, the invention provides a manufacturing method of a write-once memory that can be formed by TFT manufacturing steps similarly to other functional circuits formed on an insulating substrate. Further, the invention provides an easy-to-use and inexpensive memory device while maintaining product specifications and productivity even when a memory is formed on the same substrate as other functional circuit.

In view of the foregoing problem, the invention provides a memory device having a write-once memory function by altering a semiconductor film formed over an insulating substrate such as a glass substrate and a plastic substrate or a substrate having an insulating surface (hereinafter collectively referred to as an insulating substrate).

According to one mode of the invention, a memory device includes a memory cell formed over an insulating surface. The memory cell includes a semiconductor film having two impurity regions, a gate electrode, and two wirings connected to the respective impurity regions. The semiconductor film is altered by applying a voltage between the gate electrode and at least one of the two wirings, thereby the two wirings are insulated from each other.

According to another mode of the invention, a memory device includes a first memory cell and a second memory cell that are formed over an insulating surface. Each of the first memory cell and the second memory cell includes a semiconductor film having two impurity regions, a gate electrode, and two wirings connected to the respective impurity regions. The first memory cell has an insulating state between the two wirings by applying a voltage between the gate electrode and at least one of the two wirings to alter the semiconductor film. The second memory cell has an initial state. The memory device can have either the insulating state or the initial state.

According to another mode of the invention, a memory device includes a memory cell formed over an insulating surface. The memory cell includes a semiconductor film having one or two impurity regions, an electrode, and two wirings connected to the respective impurity regions. The semiconductor film is altered by applying a voltage between the electrode and at least one of the two wirings, thereby the two wirings are insulated from each other.

According to another mode of the invention, a memory device includes a first memory cell and a second memory cell that are formed over an insulating surface. Each of the first memory cell and the second memory cell includes a semiconductor film having one or two impurity regions, an electrode, and two wirings connected to the respective impurity regions. The first memory cell has an insulating state between the two wirings by applying a voltage between the electrode and at least one of the two wirings to alter the semiconductor film. The second memory cell has an initial state. When seen from the top of the insulating substrate, the electrode is interposed between the two wirings.

According to the invention, the memory device may include one or more gate electrodes or electrodes.

According to the aforementioned structures, a write-once memory can be formed on an insulating substrate by TFT manufacturing steps. That is, the memory device of the invention can be formed by TFT manufacturing steps similarly to other functional circuits formed on an insulating substrate, which can suppress an increase in extra cost due to additional manufacturing steps of a memory. In addition, since a memory and other functional circuits can be formed by the same steps, the memory does not limit product specifications and not decrease productivity.

A glass substrate and a plastic substrate are quite inexpensive as compared to a silicon substrate. Further, it is possible to use an insulating substrate with a larger area than a silicon substrate that is limited to a small area. Thus, the number of products manufactured on an insulating substrate increases than that manufactured on a silicon substrate, leading to a very inexpensive semiconductor device.

According to the invention, a write-once memory is formed by TFT manufacturing steps, thereby an easy-to-use and inexpensive memory device can be provided while maintaining product specifications and productivity even when a memory is formed on the same substrate as other functional circuit.

BRIEF DESCRIPTION OF DRAWINGS

FIGS. 7A and 7B are diagrams showing manufacturing steps of a TFT.

BEST MODE FOR CARRYING OUT THE INVENTION

Figure 1A:
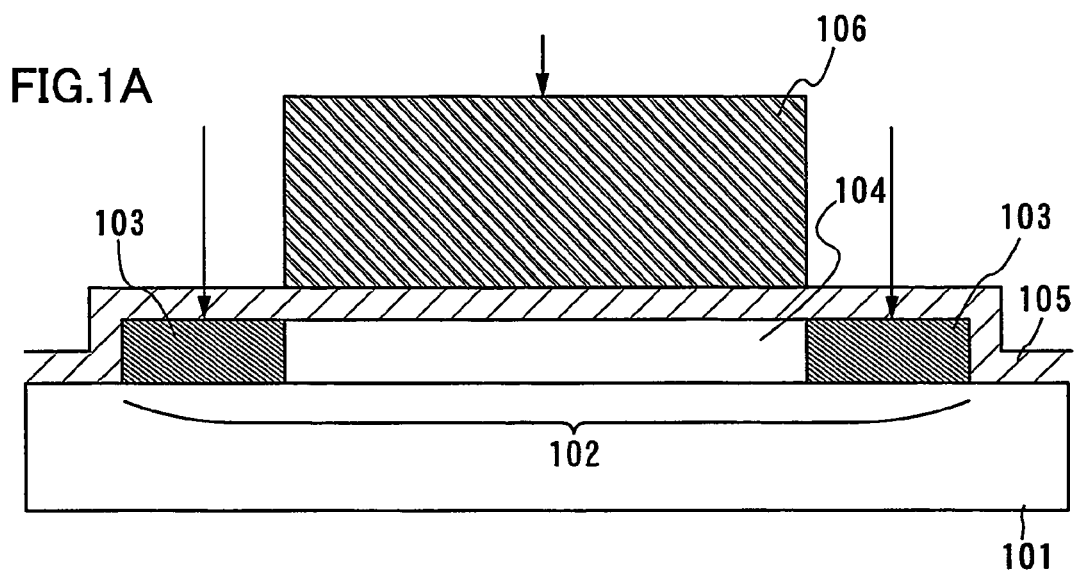
FIGS. 1A and 1B are schematic views showing operations of a memory cell in a memory device of the invention.

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings, the same components or components having the same function are denoted by the same reference numerals, and description thereof is omitted.

Embodiment Mode 1

Figure 1B:
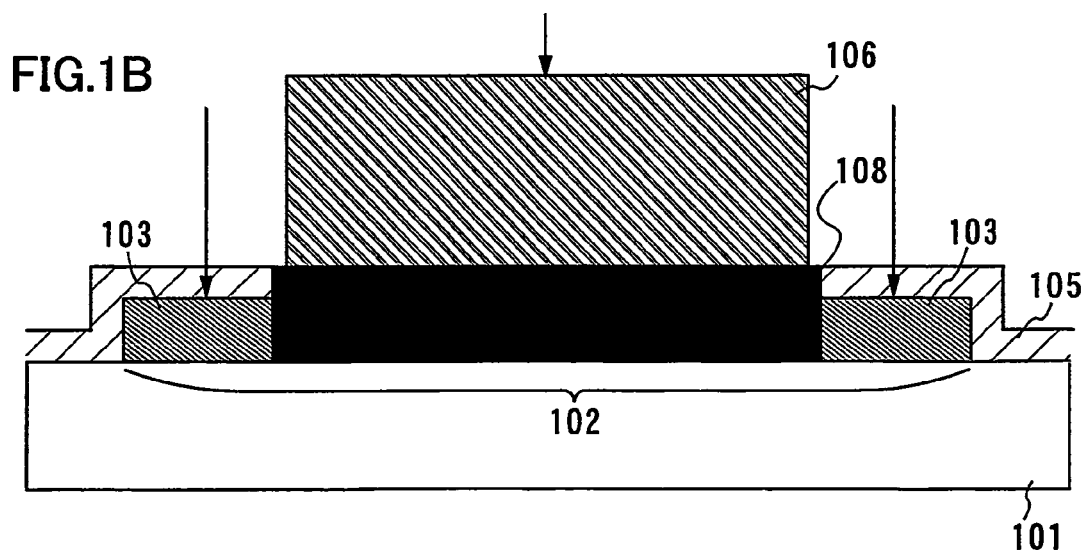

When a voltage higher than required for normal operation of a TFT is applied between a gate electrode and at least one of two impurity regions (including a high concentration impurity region) of the TFT formed on an insulating substrate, a channel region of the TFT is insulated. This operation is shown in FIGS. 1A and 1B that are cross sectional views of a TFT before and after being applied a voltage respectively. For example, a TFT shown in FIG. 1A has a semiconductor film 102 formed over an insulating substrate 101, a gate insulating film 105 over the semiconductor film 102, and a gate electrode 106 over the gate insulating film 105. The semiconductor film 102 includes two high concentration impurity regions 103 and a channel region 104. FIG. 1B shows the TFT after being applied a voltage. In the TFT, at least the channel region 104 of the semiconductor film 102 is altered and an insulating region 108 is formed under the gate electrode 106. Then, the gate electrode 106 and the two high concentration impurity regions 103 are insulated from each other. The insulating region 108 shown in FIG. 1B is a typical example, and it may have various shapes practically.

Figure 10A:
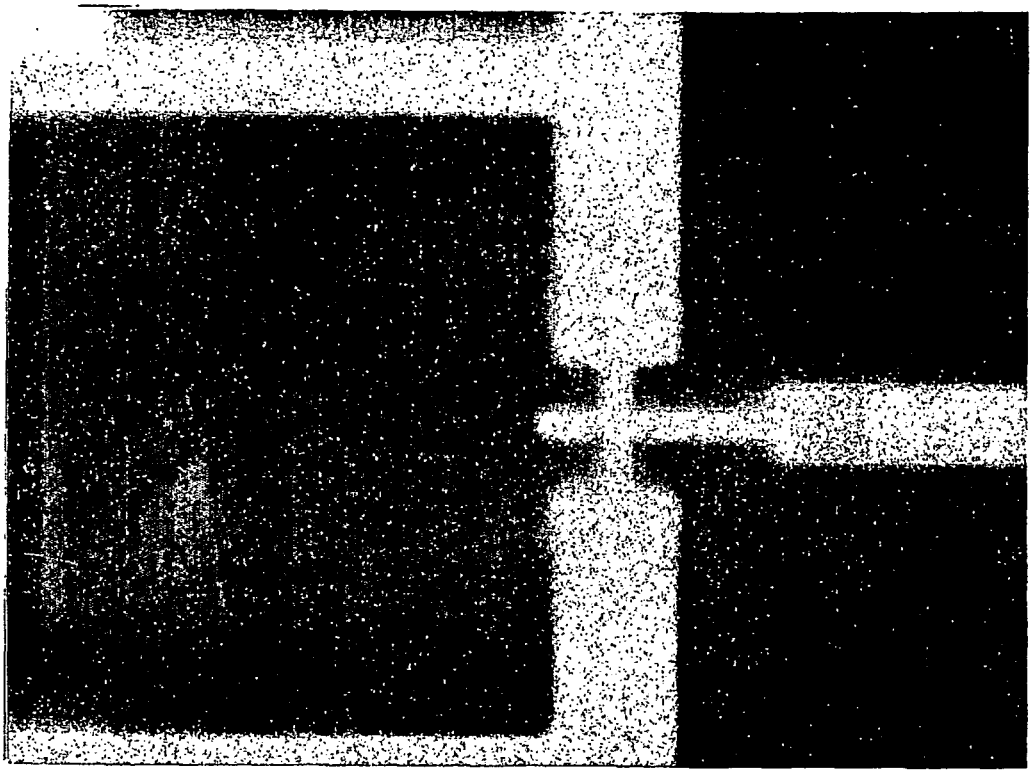
FIGS. 10A and 10B are photographs showing TFTs of the invention before and after being applied a voltage, respectively.
Figure 10B:
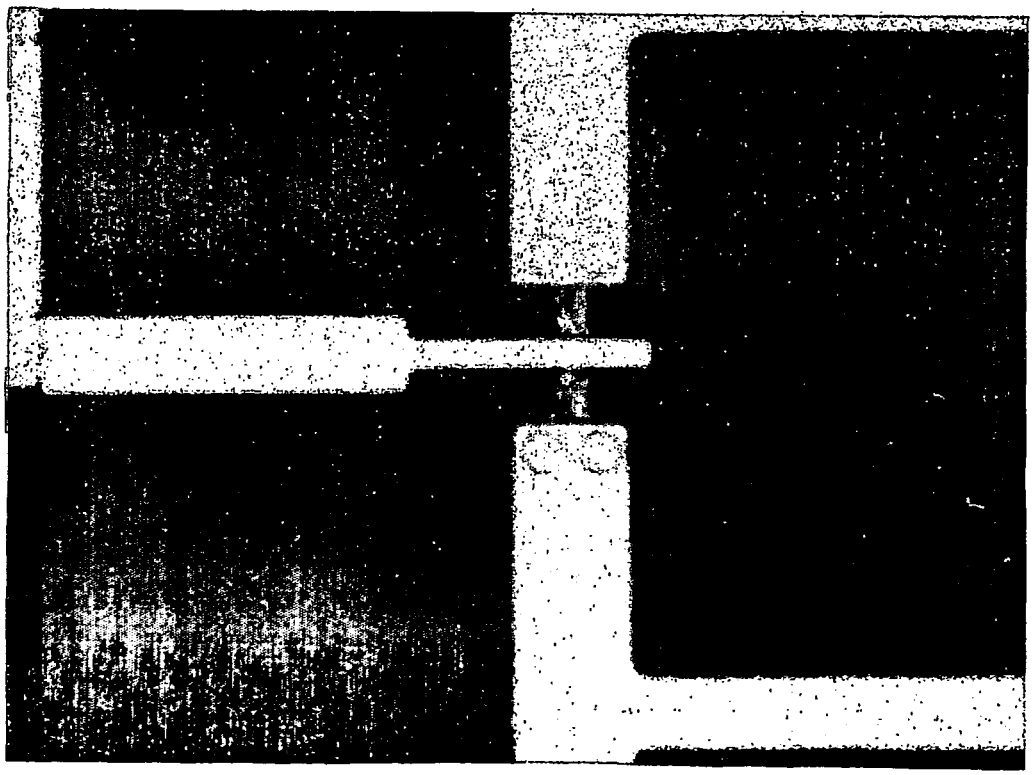

For example, in a TFT formed on a glass substrate, which has a channel length (hereinafter abbreviated to L) of 4 μm, a channel width (hereinafter abbreviated to W) of 4 μm, and a gate insulating film with a thickness (hereinafter abbreviated to GI) of 20 nm, a voltage of 25 V is applied between the gate electrode and at least one of the two high concentration impurity regions for 500 μseconds. Then, the channel region of the TFT is insulated and the gate electrode and the two high concentration impurity regions are insulated from each other. Actual photographs of the TFT before and after being applied a voltage are shown in FIGS. 10A and 10B. FIG. 10A is a photograph of the TFT before being applied a voltage and FIG. 10B is a photograph of the TFT after being applied a voltage, which is seen from the back side of the glass substrate.

Alteration in this specification means specifically a change of at least the channel region into an insulating state, as from FIG. 10A to FIG. 10B, due to a voltage applied to the TFT. It is needless to say that by changing the voltage application conditions, at least a channel region of a TFT can be insulated even when the TFT has a different size than that shown in FIGS. 10A and 10B. Note that the insulating state means a state where electricity and heat are not conducted.

In this manner, when a voltage higher than required for normal operation of a TFT is applied between a gate electrode and at least one of two impurity regions (high concentration impurity regions in this embodiment mode), a current flows through a gate insulating film. The insulating film is made of a highly resistant substance in many cases, and heat is generated when a current flows therethrough. When a large amount of heat is generated in a TFT formed on an insulating substrate, the heat cannot escape because of the low thermal conductivity of the insulating substrate, thereby the gate insulating film or a semiconductor film are burned. As a result, the gate electrode and the two high concentration impurity regions can be insulated from each other. On the other hand, in a transistor formed on a silicon substrate with high thermal conductivity, heat generated when a current flows through a gate insulating film does not burn the insulating film and the silicon substrate.

According to the experiment in the invention, when a voltage is applied between a gate electrode and at least one of two high concentration impurity regions, a channel region is altered to an insulating state no less than 97% of the time, thereby the gate electrode and the two high concentration impurity regions are insulated from each other, namely they are brought into a non-conductive state. A defective element is detected the rest 3% of the time, where a channel region functions as a resistor after being applied a voltage and three terminals are conducted to each other. Defective elements may be caused by dust in a semiconductor film or an insulating film. Therefore, improved accuracy of manufactured TFTs allows defective elements to be further reduced. The generation of defective elements can also be suppressed when a TFT has a double gate structure or a redundant circuit is provided additionally.

As another defect, two of three terminals that are a gate electrode and two wirings connected to an impurity region may be conducted to each other. The defects such as conduction between three terminals or two terminals may be caused by excess voltage applied in writing as well as dust. Accordingly, the number of defective elements can be reduced by optimizing a writing voltage and voltage application time.

A memory device stores data when a memory cell selects one of two states. The memory device of the invention can store data when a TFT as a memory cell selects one of two states: whether a channel region of the TFT is in an initial state or an insulating state. In a write-once memory manufactured in the invention, a TFT in the initial state before being applied a voltage has a state '1' while the TFT including a channel region altered to an insulating state by applying a voltage has a state '0'. This relation between states '0' and '1' and the states of the TFT is not limited to this, though it is used in this specification for convenience.

Figure 2:
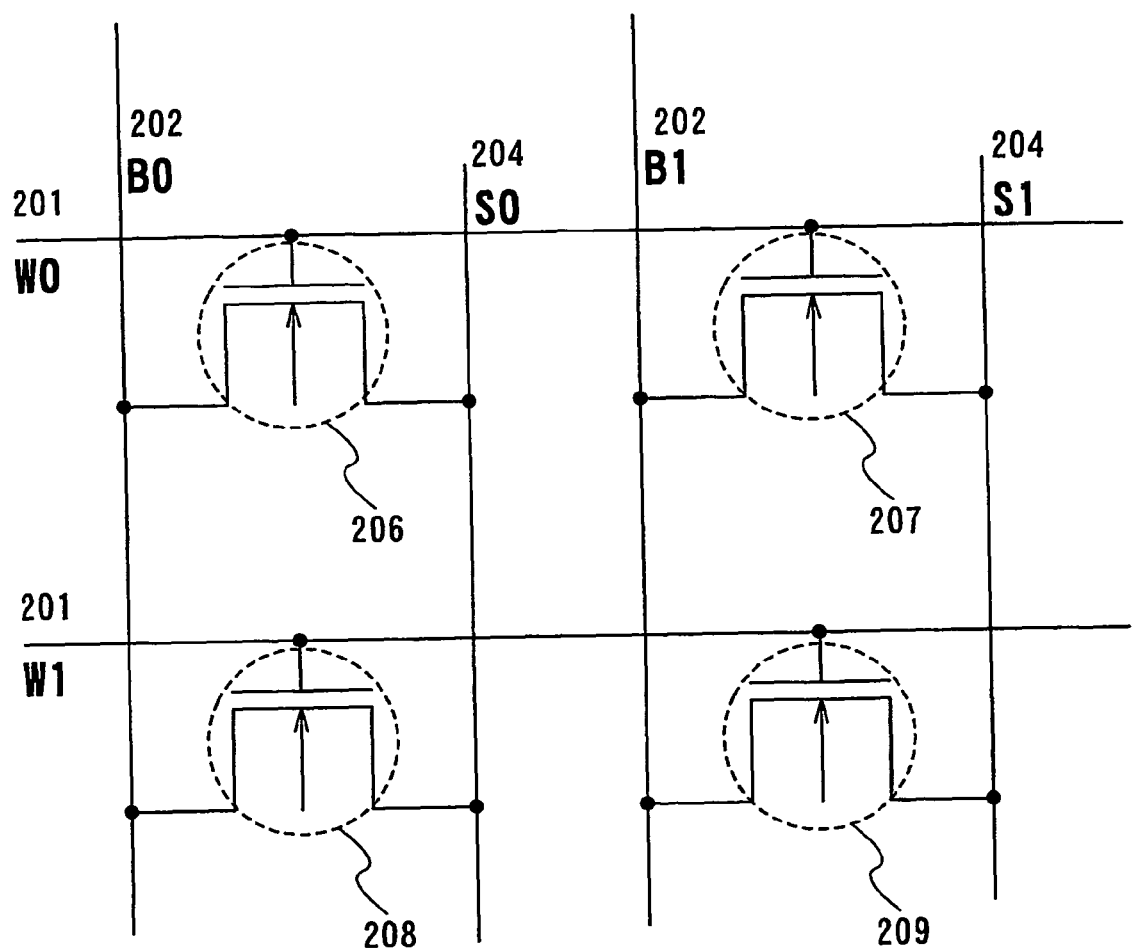
FIG. 2 is a diagram showing an example of a memory cell array.

FIG. 2 is a circuit diagram of a 4-bit memory cell array showing an example of the memory device of the invention. The memory cell array includes two word lines 201, two bit lines 202, two source lines 204, and four TFTs 206 to 209. The word lines 201, the bit lines 202, and the source lines 204 are denoted as W0, W1, B0, B1, S0, and S1 respectively. When a voltage of 25 V or higher is applied between a gate electrode and at least one of two impurity regions for 500 μseconds, as set forth above, each channel region of the TFTs 206 to 209 is altered to an insulating state.

Described first is an example of a circuit operation for writing '0' to the TFT 206. The writing operation can be performed by applying a voltage between the gate electrode and at least one of the two impurity regions of the TFT 206. For example, a voltage of 25 V is applied to W0 and a voltage of 0 V is applied to B0 and S0 for 500 μseconds. At this time, it is necessary to determine the voltages of W1, B1 and S1 so that '0' is not written to the other TFTs. For example, a voltage of 0 V is applied to W1 and a voltage of 10 V is applied to B1 and S1. By applying these voltages, a voltage of 25 V is applied between the gate electrode and at least one of the two impurity regions of the TFT 206, thereby the channel region of the TFT 206 can be insulated.

Brief description is made on the operation of the other TFTs in writing '0' to the TFT 206. Since a voltage of 25 V is applied to W0 and a voltage of 10 V is applied to B1 and S1, a voltage of 15 V is applied between the gate electrode and at least one of the two impurity regions of the TFT 207. However, '0' is not written to the TFT 207 because a voltage of 25 V or higher is not applied thereto. Similarly, '0' is not written to the TFT 208 since a voltage of 0 V is applied to W1, B0 and S0. A voltage of 0 V is applied to W1 while a voltage of 10 V is applied to B0 and S0, therefore, a voltage of 10 V is applied between the gate electrode and the semiconductor film of the TFT 209, though '0' is not written thereto. Note that the voltages applied here are just examples, and a signal can be written only to a selected TFT by arbitrarily determining the voltages of each word line 201, bit line 202 and source line 204.

Described next is an example of a circuit operation for writing '1' to the TFT 206. When '1' is written to the TFT 206, no voltage is applied between the gate electrode and at least one of the two impurity regions while maintaining the TFT 206 in an initial state. Accordingly, for example, all the word lines 201, bit lines 202 and source lines 204 may have the same voltage so that '0' is not written to the TFT 206. This is just an example and the potential of each word line 201, bit line 202 and source line 204 may be determined by a controlling method of a circuit.

Reading operation of the TFT 206 is described next. The reading operation determines whether the TFT 206 is in the state '1', namely in the initial state without being applied a voltage or the TFT 206 is in the state '0', namely altered to an insulating state. Thus, a voltage of a threshold or higher is applied to the gate electrode of the TFT 206 to determine whether a current flows between the two high concentration impurity regions. First, before reading, B0 is precharged to 5 V. Then, voltages of 5 V and 0 V are applied to W0 and S0 respectively to read the potential of B0. At this time, it is necessary to determine the voltages of W1, B1 and S1 so that the other TFTs are not selected. For example, a voltage of 0 V is applied to W1 and S1 so as not to read the potential of B1. When the TFT 206 is in the state '1' without being applied a voltage, the two impurity regions are conducted and a voltage of 0 V is applied to B0 since a voltage of 5 V is applied to W0. On the other hand, when the TFT 206 is applied a voltage and brought into the state '0', B0 is maintained at 5 V since B0 and S0 are insulated from each other. The reading operation of the TFT 206 can thus be performed by applying a voltage equal to or higher than a threshold to W0 and reading a change in the potential of B0.

Brief description is made on the operation of the other TFTs in the reading operation of the TFT 206. Since B1 is not selected to read, the reading operation does not involve the TFT 207 and the TFT 209. The TFT 208 does not change the potential of the bit line since W0 has a voltage of 0 V. Therefore, the other TFTs do not influence the reading operation of the TFT 206.

As set forth above, in this embodiment mode, a memory cell has two states: switching state and insulating state. Thus, a memory cell can be constituted by only one TFT, leading to reduced area of a memory cell array and increased memory capacity.

Embodiment Mode 2

In a memory device of the invention, a high concentration impurity may be added over the entire surface of a semiconductor film of TFT as a memory cell. Instead, an impurity may be added to any portion of a semiconductor film and two wirings may be connected thereto; however, when forming an impurity region arbitrarily, the element does not function as a transistor. Meanwhile, when a high concentration impurity is added over the entire surface of a semiconductor film, all the three terminals can be insulated from each other by applying a voltage between an electrode and at least one of two wirings.

Figure 3A:
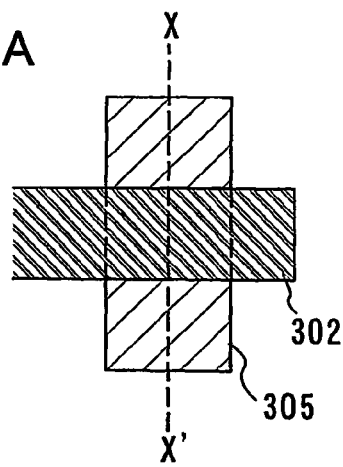
FIGS. 3A to 3E are top plan views and cross sectional views of a resistor.
Figure 3B:
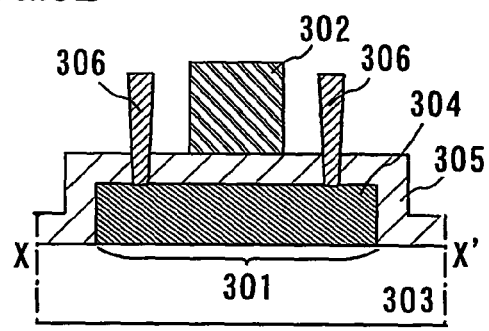
Figure 3C:
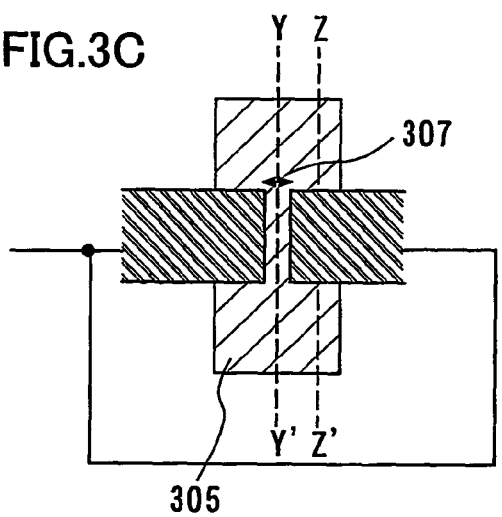
Figure 3D:
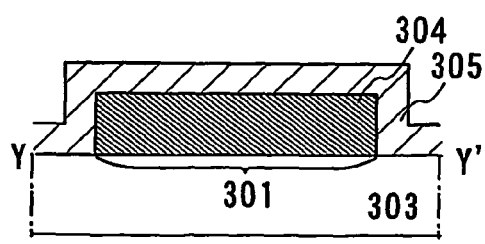
Figure 3E:
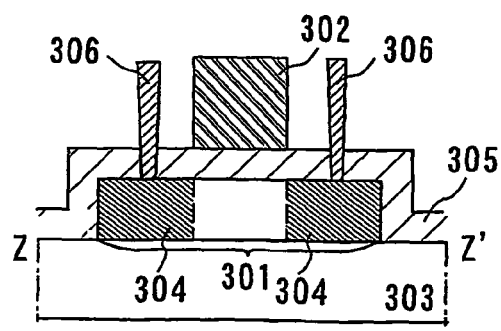

Described in this embodiment mode is an example where one impurity region (high concentration impurity region in this embodiment mode) is formed over a semiconductor film on an insulating substrate and two wirings are connected to the semiconductor film with one electrode interposed therebetween. FIGS. 3A and 3C are top plan views of an element having such a structure. FIGS. 3B, 3D, and 3E are cross sectional views of an element having such a structure. FIGS. 3A and 3B show a normal TFT where a high concentration impurity is added to a semiconductor film before forming a gate electrode on an insulating film. FIGS. 3C, 3D, and 3E show a TFT including a void 307 with an arbitrary width in a gate electrode, where a high concentration impurity is added to a semiconductor film after forming the electrode. The width of the void 307 should be determined so that the two wirings are insulated when applying a voltage between the electrode and the semiconductor film. Both the elements shown in FIGS. 3A and 3C have the two wirings conducted through the high concentration impurity region of the semiconductor film, thus these elements are referred to as resistor elements in this specification to be distinguished from TFTs.

In each of the resistor elements shown in FIGS. 3A to 3E, a semiconductor film 301 is formed over an insulating substrate 303, an insulating film 305 is formed over the semiconductor film 301, and an electrode 302 is formed over the insulating film 305. Two wirings 306 are connected to a high concentration impurity region 304 in the semiconductor film 301. The high concentration impurity region 304 in the semiconductor film 301 and the wirings 306 connected to the semiconductor film 301 may be formed anywhere as long as the electrode 302 is formed between the two wirings 306. The form of the electrode 302 can also be determined arbitrarily as shown in FIG. 3C where the void 307 with an arbitrary width is formed in the gate electrode. Further, the form of the resistor element can be arbitrarily determined as well, and FIGS. 3A to 3E show just examples.

For example, the resistor element shown in FIG. 3A has an L of 4 μm, a W of 4 μm, and a GI of 20 nm, and a voltage of 25 V is applied between the electrode and at least one of the two wirings for 500 μseconds similarly to Embodiment Mode 1. Then, the electrode and the two wirings are insulated from each other. Needless to say, even when the element has a different size than that shown here, the three terminals can be insulated from each other by changing the voltage application conditions. In this embodiment mode, a write-once memory is manufactured utilizing such a structure.

Figure 4:
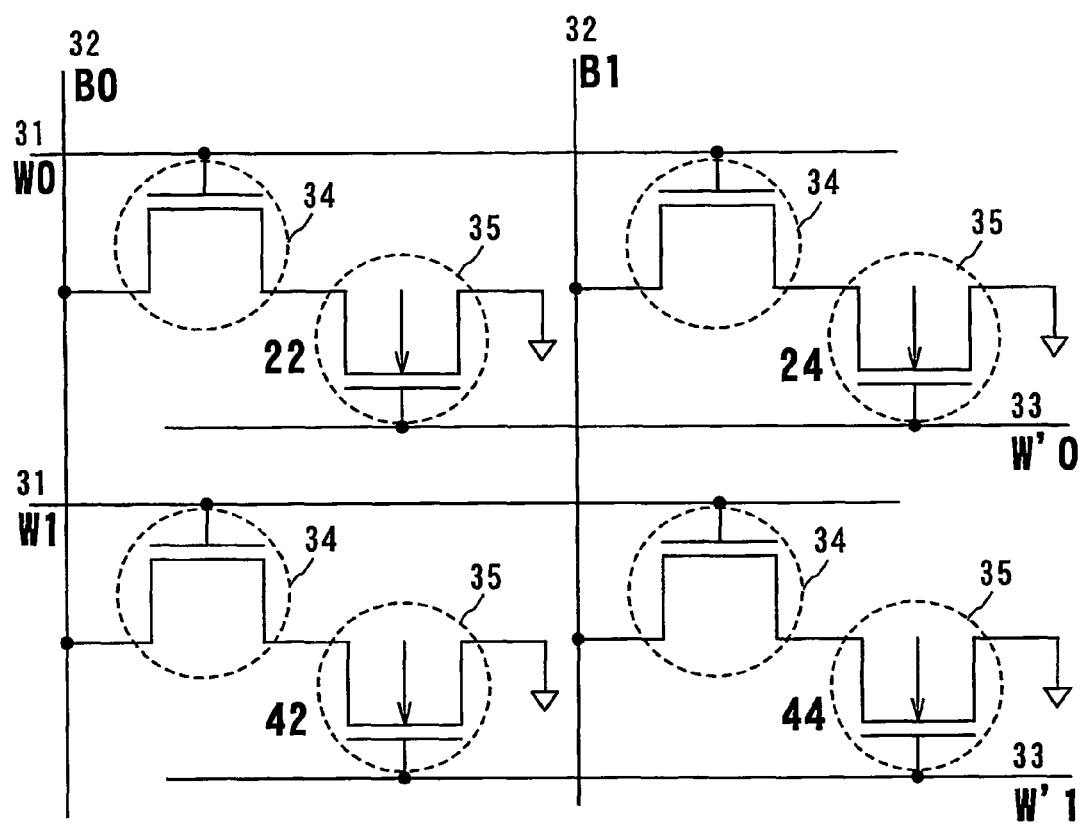
FIG. 4 is a diagram showing an example of a memory cell array.

FIG. 4 is a circuit diagram of a 4-bit memory cell array showing an example of this embodiment mode. The memory cell array includes two word lines 31, two bit lines 32, two selection control lines 33, four resistor elements 34, and four selection transistors 35. The word lines 31, the bit lines 32 and the selection control lines 33 are denoted as W0, W1, B0, B1, W'0, and W'1 respectively. A memory cell 22 is selected by W0 and B0, a memory cell 24 is selected by W0 and B1, a memory cell 42 is selected by W1 and B0, and a memory cell 44 is selected by W1 and B1. Similarly to the example shown in FIGS. 3A and 3B, an electrode and two impurity regions of the resistor element 34 are insulated from each other when applying a voltage of 25 V or higher between the electrode and at least one of the two impurity regions. Note that in this embodiment mode, the impurity region may be formed over the entire surface of the semiconductor film, thus a voltage is applied between the electrode and the semiconductor film.

Described first is an example of a circuit operation for writing '0' to the memory cell 22. The writing operation can be performed by applying a voltage between the electrode and the semiconductor film, namely at least one of the two wirings connected to the semiconductor film of the resistor element 34 in the memory cell 22. For example, a voltage of 25 V is applied to W0 and a voltage of 0 V is applied to B0 and W'0 for 500 μseconds. At this time, it is necessary to determine the voltages of W1, B1 and W'1 so that '0' is not written to the other resistor elements. For example, a voltage of 0 V is applied to W1 and W'1 and a voltage of 10 V is applied to B1.

By applying these voltages, a voltage of 25 V can be applied between the electrode and the semiconductor film of the resistor element 34 in the memory cell 22, thereby the electrode and the two wirings can be insulated from each other. The applied voltages shown here are just examples and the writing operation can be performed by other conditions as well.

Brief description is made on the operation of the other memory cells in writing '0' to the memory cell 22. Since a voltage of 25 V is applied to W0, a voltage of 10 V is applied to B1, and a voltage of 0 V is applied to W'0, a voltage of 15 V is applied between the electrode and the semiconductor film of the memory cell 24. However, '0' is not written to the memory cell 24 because a voltage of 25 V or higher is not applied thereto. Similarly, '0' is not written to the memory cell 42 since a voltage of 0 V is applied to W1, W'1 and B0. A voltage of 0 V is applied to W1 and W'1 while a voltage of 10 V is applied to B0, therefore, a voltage of 10 V is applied between the electrode and the semiconductor film of the memory cell 44, though '0' is not written thereto. In this manner, '0' can be written only to a selected memory cell by arbitrarily determining the voltages of the word lines 31, the bit lines 32 and the selection control lines 33.

Described next is an example of a circuit operation for writing '1' to the memory cell 22. When '1' is written to the memory cell 22, no voltage is applied between the electrode and the semiconductor film of the resistor element 34 while maintaining the memory cell 22 in an initial state. Accordingly, for example, all the word lines 31, bit lines 32 and selection control lines 33 may have the same voltage such as 0 V so that '0' is not written to the memory cell 22. This is just an example and the potential of each word line 31, bit line 32 and selection control line 33 may be determined arbitrarily by a controlling method of a circuit.

Reading operation of the memory cell 22 is described next. The reading operation determines whether the resistor element 34 in the memory cell 22 is in the state '1', namely in the initial state without being applied a voltage or the resistor element 34 is applied a voltage and in the state '0', namely altered to an insulating state. Thus, a voltage of a threshold or higher is applied to the gate electrode of the selection transistor 35 in the memory cell 22 to determine whether B0 is conducted to a ground of the two high concentration impurity regions of the selection transistor 35. First, before reading, B0 is precharged to 5 V. Then, a voltage of 5 V is applied to W'0. At this time, it is necessary to determine the voltages of W'1 and B1 so that the other transistors are not selected. W0 and W1 are used only in the writing operation and are not required in the reading operation. For example, a voltage of 0 V is applied to W'1 so as not to read the potential of B1. When the resistor element 34 in the memory cell 22 is in the state '1', namely in the initial state without being applied a voltage, B0 is conducted to the ground and a voltage of 0 V is applied to B0. On the other hand, when the resistor element 34 in the memory cell 22 is applied a voltage and brought into the state '0', namely in the insulating state, B0 is maintained at 5 V even when a voltage of 5 V is applied to W0 since B0 is insulated from the ground. The reading operation of the memory cell 22 can thus be performed by applying a voltage to W'0 and reading a change in the potential of B0.

Brief description is made on the operation of the other memory cells in the reading operation of the memory cell 22. Since B1 is not selected to read, the reading operation does not involve the memory cell 24 and the memory cell 44. The memory cell 42 does not change the potential of the bit line since W'0 has a voltage of 0 V. Therefore, the other memory cells do not influence the reading operation of the memory cell 22.

In this embodiment mode, each memory cell includes the two elements, which increases the area of the memory cell array. In such a case, however, an element using a high voltage in writing (e.g., a decoder connected to W0 or W1) and an element using a low voltage in reading (e.g., a decoder connected to W'0 or W'1) can be formed separately. When using a high voltage, a TFT is required to have a large L to withstand a high voltage. However, the TFT having a large L is not suitable for high speed operation, thus a TFT using a low voltage generally has a small L. Accordingly, it is very advantageous that the elements are formed separately for high speed operation and easy operation control. In this embodiment mode, a TFT can be used instead of the resistor element 34 and a memory TFT and a selection TFT can be formed separately in a memory cell.

EMBODIMENT

Embodiment 1

In this embodiment, a manufacturing method of a TFT on a glass substrate is specifically described with reference to FIGS. 5A to 5E, FIGS. 6A to 6D and FIGS. 7A and 7B. Description is made with reference to cross sectional views of an N-channel TFT and a P-channel TFT.

Figure 5A:
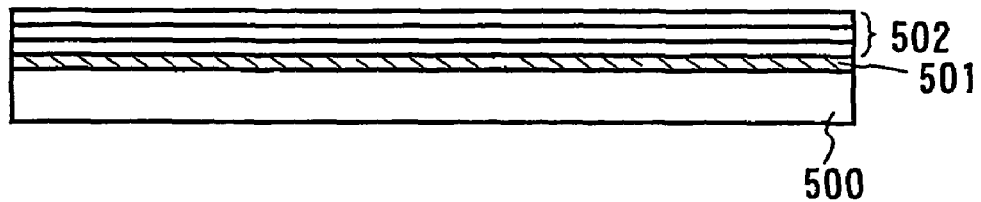
FIGS. 5A to 5E are diagrams showing manufacturing steps of a TFT.

First, a peeling layer 501 is formed over a substrate 500 (FIG. 5A). In this embodiment, an a-Si film (amorphous silicon film) with a thickness of 50 nm is formed over a glass substrate (e.g., a 1737 substrate, product of Corning Incorporated) by low pressure CVD. As for the substrate 500, a quartz substrate, a substrate made of an insulating material such as alumina, a silicon wafer substrate, a plastic substrate having enough heat resistance to the treatment temperature in the subsequent step, and the like may be employed as well as the glass substrate. The peeling layer 501 is preferably formed of a film mainly containing silicon such as polycrystalline silicon, single crystalline silicon and SAS (semi-amorphous silicon that is also referred to as microcrystalline silicon) as well as amorphous silicon, though the invention is not limited to these. The peeling layer 501 may be formed by plasma CVD or sputtering as well as low pressure CVD. A film doped with an impurity such as phosphorous may be employed as well. The thickness of the peeling layer 501 is desirably 50 to 60 nm, though it may be 30 to 50 nm in the case of employing an SAS.

Next, a protective film 502 (also referred to as a base film or a base insulating film) is formed over the peeling layer 501 (FIG. 5A). In this embodiment, the protective film 502 has a three-layer structure where a SiON film with a thickness of 100 nm, a SiNO film with a thickness of 50 nm, and a SiON film with a thickness of 100 nm are stacked in this order from the substrate side, though the material, the thickness, and the number of layers are not limited to these. For example, instead of the SiON film on the bottom layer, a heat resistant resin such as siloxane with a thickness of 0.5 to 3 μm may be formed by spin coating, slit coating, droplet discharging, or the like. Alternatively, a silicon nitride film (SiN, $Si_3N_4$ or the like) may be employed. The thickness of each layer is preferably in the range of 0.05 to 3 μm and can be selected within this range as required. A silicon oxide film can be formed by thermal CVD, plasma CVD, atmospheric pressure CVD, bias ECRCVD, or the like using a mixed gas of $SiH_4$ and $O_2$, TEOS (tetraethoxy silane) and $O_2$, or the like. A silicon nitride film can be typically formed by plasma CVD using a mixed gas of $SiH_4$ and $NH_3$. A SiON film or a SiNO film can be typically formed by plasma CVD using a mixed gas of $SiH_4$ and $N_2O$.

Figure 5B:
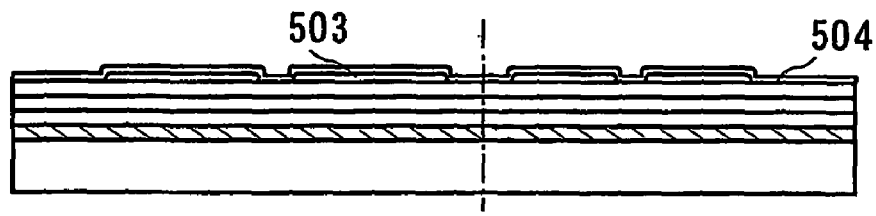

Subsequently, TFTs are formed over the protective film 502. Note that other thin film active elements such as organic TFTs and thin film diodes may be formed as well as the TFTs. In order to form a TFT, first, an island shape semiconductor film 503 is formed over the protective film 502 (FIG. 5B). The island shape semiconductor film 503 is formed using an amorphous semiconductor, a crystalline semiconductor or a semi-amorphous semiconductor, which mainly contains silicon, silicon germanium (SiGe), or the like. Note that if a material mainly containing silicon such as a-Si is employed for the peeling layer 501 and the island shape semiconductor film 503, the protective film 502 that is in contact with them may be formed using $SiO_xN_y$ in view of the adhesiveness. In this embodiment, an amorphous silicon film with a thickness of 70 nm is formed and the surface thereof is treated with a solution containing nickel. Thermal crystallization is performed at a temperature of 500 to 750° C. so that a crystalline silicon semiconductor film is obtained. Then, the crystallinity thereof may be improved by laser crystallization. Note that the film may be formed by plasma CVD, sputtering, LPCVD, or the like. As a crystallizing method, laser crystallization, thermal crystallization, or thermal crystallization using a catalyst other than nickel (Fe, Ru, Rh, Pd, Os, Ir, Pt, Cu, Au, or the like) may be adopted, or such methods may be performed alternately a plurality of times.

Alternatively, the semiconductor film having an amorphous structure may be crystallized by a continuous wave laser. In order to obtain a crystal with a large grain size during crystallization, a solid state laser capable of continuous wave may be used and it is preferable to apply second to fourth harmonics of a fundamental wave (the crystallization in this case is referred to as CWLC). Typically, a second harmonic (532 nm) or a third harmonic (355 nm) of a $Nd:YVO_4$ laser (a fundamental wave: 1064 nm) is applied. When a continuous wave laser is used, laser light emitted from a continuous wave $YVO_4$ laser having an output of 10 W is converted into a harmonic by a non-linear optical element. There is also a method for emitting a harmonic by putting a $YVO_4$ crystal or a $GdVO_4$ crystal and a non-linear optical element in a resonator. Then, the laser light is preferably formed in a rectangular shape or an ellipse shape at an irradiated surface with an optical system to irradiate a subject. In that case, an energy density of about 0.01 to 100 $MW/cm^2$ (preferably 0.1 to 10 $MW/cm^2$) is required. Then, the semiconductor film is preferably irradiated with laser light while being moved relatively to the laser light at a speed of about 10 to 2000 cm/sec.

When a pulsed laser is used, a pulsed laser having a frequency band of several tens to several hundreds Hz is generally used, though a pulsed laser having an extremely higher oscillation frequency of 10 MHz or higher may be used as well (the crystallization in this case is referred to as MHzLC). It is said that it takes several tens to several hundreds nsec to solidify a semiconductor film completely after the semiconductor film is irradiated with the pulsed laser light. When the pulsed laser light has an oscillation frequency of 10 MHz or higher, it is possible to irradiate the next pulsed laser light before the semiconductor film is solidified after it is melted by the previous laser light. Therefore, unlike the case of the conventional pulsed laser, the interface between the solid phase and the liquid phase can be moved continuously in the semiconductor film, and thus the semiconductor film having a crystal grain grown continuously along the scanning direction can be formed. More specifically, it is possible to form an aggregation of crystal grains each of which has a width of 10 to 30 µm in the scanning direction and a width of about 1 to 5 µm in the direction perpendicular to the scanning direction. By forming such single crystal grains extending long in the scanning direction, a semiconductor film having few crystal grain boundaries at least in the channel direction of the TFT can be formed. Note that when the protective film 502 is partially formed using siloxane that is a heat resistant organic resin, heat leak from the semiconductor film can be prevented in the aforementioned crystallization, leading to effective crystallization.

The crystalline silicon semiconductor film is obtained through the aforementioned steps. The crystals thereof are preferably aligned in the same direction as the source, channel and drain direction. The thickness of the crystalline layer thereof is preferably 20 to 200 nm (typically 40 to 170 nm, and more preferably 50 to 150 nm). Subsequently, an amorphous silicon film for gettering of a metal catalyst is formed over the semiconductor film with an oxide film interposed therebetween, and heat treatment is performed at a temperature of 500 to 750° C. for gettering. Furthermore, in order to control a threshold value as a TFT element, boron ions are injected into the crystalline silicon semiconductor film at a dosage of $10^{13}/cm^2$. Then, etching is performed with a resist used as a mask to form the island shape semiconductor film 503. Alternatively, the crystalline semiconductor film may be obtained by forming a polycrystalline semiconductor film directly by LPCVD (Low Pressure CVD) using a source gas of disilane ($Si_2H_6$) and germanium fluoride ($GeF_4$). The flow rate of the gas is such that $Si_2H_6/GeF_4=20/0.9$, the temperature for forming the film is 400 to 500° C., and He or Ar is used as a carrier gas, though the invention is not limited to these conditions.

A TFT, particularly the channel region thereof is preferably added with hydrogen or halogen of $1\times10^{19}$ to $1\times10^{22}$ $cm^3$, and more preferably $1\times10^{19}$ to $5\times10^{20}$ $cm^{-3}$. In the case of using an SAS, it is preferably added with hydrogen or halogen of $1\times10^{19}$ to $2\times10^{21}$ $cm^{-3}$. In either case, it is desirable that the amount of hydrogen or halogen be larger than that contained in silicon single crystals used for an IC chip and the like. According to this, local cracks that may be generated at the TFT portion can be terminated by hydrogen or halogen.

Then, a gate insulating film 504 is formed over the island shape semiconductor film 503 (FIG. 5B). The gate insulating film 504 is preferably formed of a single layer or stacked layers of a film containing silicon nitride, silicon oxide, silicon nitride oxide, or silicon oxynitride by a thin film forming method such as plasma CVD and sputtering. In the case of the stacked layers, a three-layer structure may be adopted for example, where a silicon oxide film, a silicon nitride film and a silicon oxide film are stacked in this order from the substrate side.

Figure 5C:
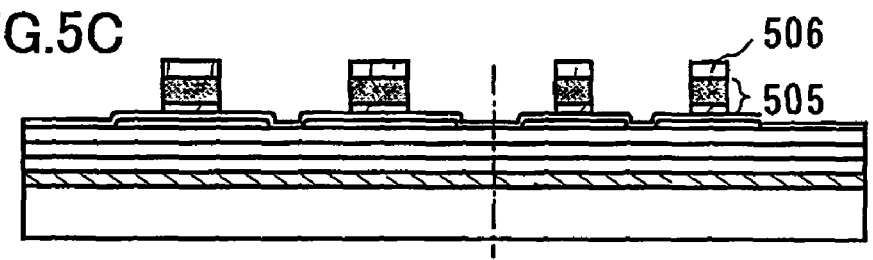
Figure 5D:
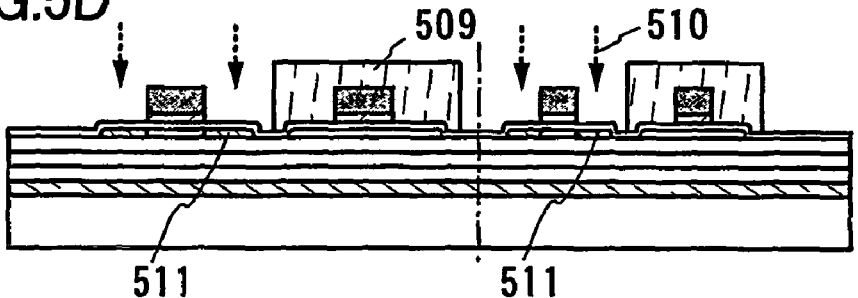
Figure 5E:
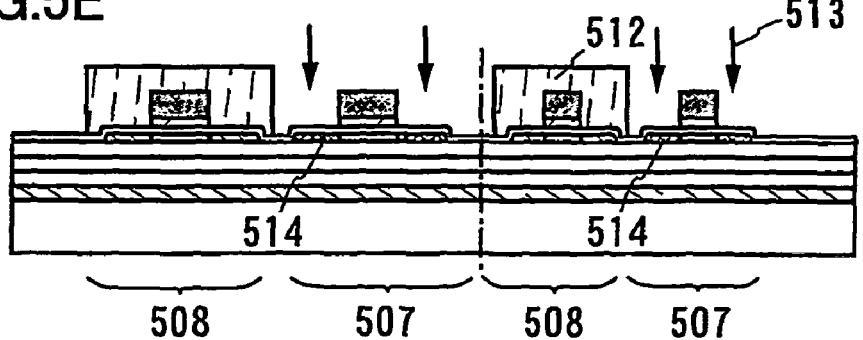

Subsequently, a gate electrode 505 is formed (FIG. 5C). In this embodiment, Si and W (tungsten) are stacked by sputtering, and etched with a resist 506 used as a mask to form the gate electrode 505. Needless to say, the material, the structure and the forming method of the gate electrode 505 are not limited to these and can be selected appropriately. For example, a stacked structure of Si and NiSi (Nickel Silicide) doped with an N-type impurity, or a stacked structure of TaN (tantalum nitride) and W (tungsten) may be employed. Alternatively, the gate electrode 505 may be formed of a single layer employing any conductive material. A mask of $SiO_x$ or the like may be used instead of the resist mask. In this case, a patterning step of the mask such as $SiO_x$ and SiON (such a mask made of an inorganic material is referred to as a hard mask) is additionally required, while the mask film is less decreased in etching as compared with the resist, thereby a gate electrode layer with a desired width can be formed. Alternatively, the gate electrode 505 may be selectively formed by droplet discharging without using the resist 506. As for the conductive material, various kinds of materials can be selected depending on the function of the conductive film. When the gate electrode and an antenna are simultaneously formed, the material may be selected in consideration of their functions. As an etching gas for etching the gate electrode, a mixed gas of $CF_4$, $Cl_2$ and $O_2$, or a $Cl_2$ gas is employed here, though the invention is not limited to this.

Subsequently, a resist 509 is formed so as to cover portions to be P-channel TFTs 507. An N-type impurity element 510 (typically, P (phosphorous) or As (arsenic)) is doped to the island shape semiconductor films of N-channel TFTs 508 at a low concentration with the gate electrode used as a mask (a first doping step, FIG. 5D). The first doping step is performed under such conditions as a dosage of $1 \times 10^{13}$ to $6 \times 10^{13}/cm^2$ and an accelerated voltage of 50 to 70 keV, though the invention is not limited to these conditions. In the first doping step, through doping is performed through the gate insulating film 504 to form a couple of low concentration impurity regions 511. Note that the first doping step may be performed to the entire surface without covering the P-channel TFT regions with the resist 509.

After the resist 509 is removed by ashing or the like, another resist 512 is formed so as to cover the N-channel TFT regions. A P-type impurity element 513 (typically, B (boron)) is doped to the island shape semiconductor films of the P-channel TFTs 507 at a high concentration with the gate electrode used as a mask (a second doping step, FIG. 5E). The second doping step is performed under such conditions as a dosage of $1 \times 10^{16}$ to $3 \times 10^{16}/cm^2$ and an accelerated voltage of 20 to 40 keV. In the second doping step, through doping is performed through the gate insulating film 504 to form a couple of P-type high concentration impurity regions 514.

Figure 6A:
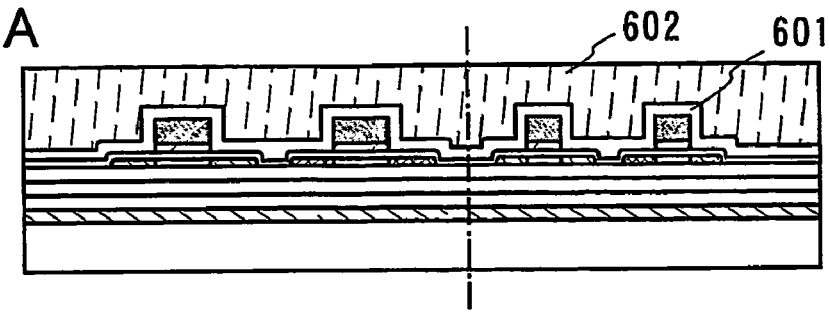
FIGS. 6A to 6D are diagrams showing manufacturing steps of a TFT.
Figure 6B:
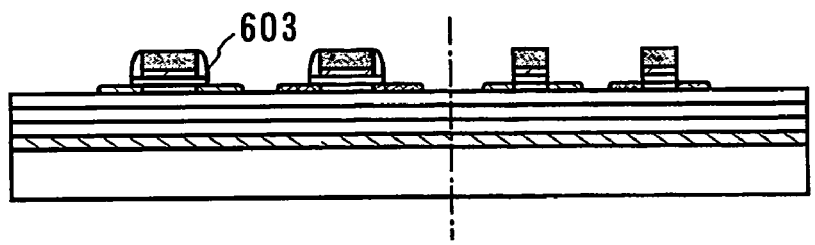
Figure 6C:
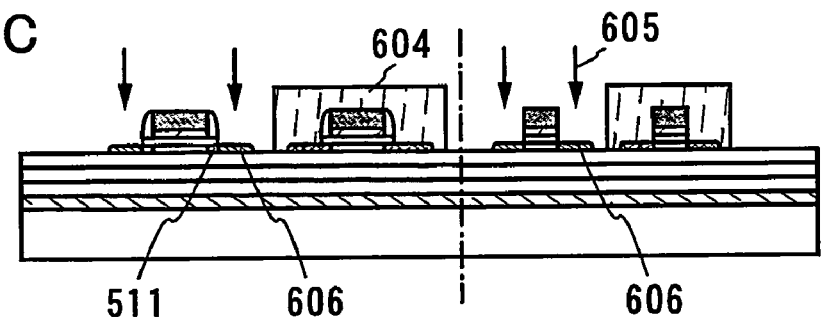

After the resist 512 is removed by ashing or the like, an insulating film 601 is formed over the entire surface of the substrate (FIG. 6A). In this embodiment, a $SiO_2$ film with a thickness of 100 nm is formed by plasma CVD. Then the entire surface of the substrate is covered with a resist 602, and resist 602, the insulating film 601 and the gate insulating film 504 are removed by etch back to form a sidewall 603 in a self-aligned manner (FIG. 6B). As an etching gas, a mixed gas of $CHF_3$ and He is employed. Note that if the insulating film 601 is formed on the back side of the substrate as well, the insulating film on the back side is etched and removed with the resist 602 used as a mask (this step is called a back side treatment).

The forming method of the sidewall 603 is not limited to the aforementioned one. For example, methods shown in FIGS. 7A and 7B may be employed as well. FIG. 7A shows an insulating film 701 having a two or more layer stacked structure. The insulating film 701 has, for example, a two-layer structure of a SiON (silicon oxynitride) film with a thickness of 100 nm and an LTO (Low Temperature Oxide) film with a thickness of 200 nm. In this embodiment, the SiON film is formed by plasma CVD, and the LTO film is formed by low pressure CVD using a $SiO_2$ film. Then, etch back is performed with the resist 602 used as a mask, thereby forming the sidewall 603 having an L shape and an arc shape. FIG. 7B shows the case where etching is performed so that the insulating film 702 is not removed by the etch back. The insulating film 702 in this case may be formed of a single layer or stacked layers. The sidewall 603 serves as a mask when an N-type impurity is doped at a high concentration in the subsequent step to form a low concentration impurity region or a non-doped offset region under the sidewall 603. In any of the aforementioned forming methods of the sidewall, the conditions of the etch back may be changed depending on the width of the low concentration impurity region or the offset region to be formed.

In the semiconductor device of the invention, the memory cell operates normally without sidewalls. Therefore, in FIG. 6B and thereafter, the two TFTs on the left side have side walls and the two TFTs on the right side does not have side walls.

Subsequently, another resist 604 is formed so as to cover the P-channel TFT regions. An N-type impurity element 605 (typically, P or As) is doped at a high concentration with the gate electrode 505 and the sidewall 603 used as masks (a third doping step, FIG. 6C). The third doping step is performed under such conditions as a dosage of $1 \times 10^{13}$ to $5 \times 10^{15}/cm^2$ and an accelerated voltage of 60 to 100 keV. In the third doping step, a couple of N-type high concentration impurity regions 606 are formed. After the resist 604 is removed by ashing or the like, thermal activation of the impurity regions may be performed. For example, a SiON film with a thickness of 50 nm is formed, and then heat treatment is performed at a temperature of 550° C. for four hours in a nitrogen atmosphere. Alternatively, it is also possible that a $SiN_x$ film containing hydrogen is formed to have a thickness of 100 nm and heat treatment is performed at a temperature of 410° C. for one hour in a nitrogen atmosphere. According to this, defects in the crystalline semiconductor film can be improved. This step enables to, for example, terminate a dangling bond in the crystalline silicon and is called a hydrotreatment step. Then, a SiON film with a thickness of 600 nm is formed as a cap insulating film for protecting the TFT. Note that the aforementioned hydrotreatment step may be performed after the formation of this SiON film. In that case, a $SiN_x$ film and a SiON film thereon may be continuously formed. In this manner, the insulating film includes three layers of SiON, $SiN_x$ and SiON that are stacked in this order from the substrate side over the TFT, though the structure and the material are not limited to these. Note that such an insulating film is preferably formed, since it also has a function to protect the TFT.

Figure 6D:
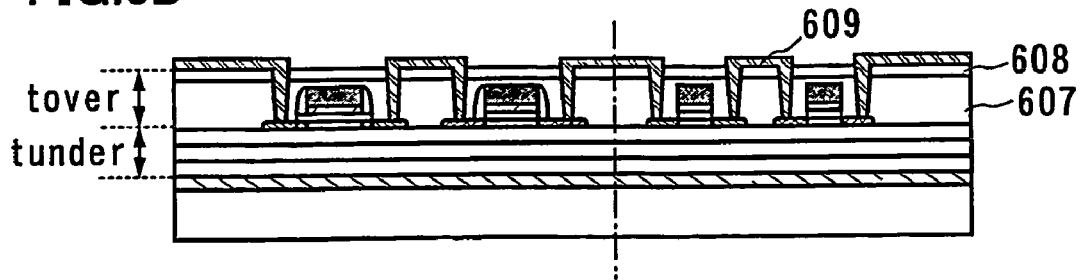

Subsequently, an interlayer film 607 is formed over the TFT (FIG. 6D). For the interlayer film 607, a heat resistant organic resin such as polyimide, acrylic, polyamide, and siloxane may be employed. The interlayer film 607 may be formed by spin coating, dipping, spray application, droplet discharging (inkjet printing, screen printing, offset printing or the like), a doctor knife, a roll coater, a curtain coater, a knife coater, or the like depending on the material thereof. Alternatively, an inorganic material may be employed such as a film of silicon oxide, silicon nitride, silicon oxynitride, PSG (phosphosilicate glass), BPSG (boron phosphosilicate glass), and alumina. These insulating films may also be stacked to form the interlayer film 604. A protective film 608 may be formed over the interlayer film 607. As the protective film 608, a film containing carbon such as DLC (Diamond Like Carbon) and carbon nitride (CN), a silicon oxide film, a silicon nitride film, a silicon nitride oxide film, or the like may be employed. The protective film 608 may be formed by plasma CVD, atmospheric pressure plasma, or the like. Alternatively, a photosensitive or nonphotosensitive organic material such as polyimide, acrylic, polyamide, resist, and benzocyclobutene, or a heat resistant organic resin such as siloxane may be employed. A filler may be mixed into the interlayer film 607 or the protective film 608 in order to prevent these films from being detached or cracked due to stress generated by a difference of thermal expansion coefficients between the interlayer film 607 or the protective film 608 and a conductive material or the like of a wiring that is formed later.

After forming a resist, etching is performed to form contact holes, so that a wiring 609 is formed (FIG. 6D). As an etching gas for forming the contact holes, a mixed gas of $CHF_3$ and He is employed, though the invention is not limited to this. The wiring 609 is formed by sputtering and patterning so as to have a five-layer structure where Ti, TiN, Al—Si, Ti, and TiN are stacked in this order from the substrate side. By mixing Si into the Al layer, hillock can be prevented from generating in the resist baking when the wiring is patterned. Instead of Si, Cu of about 0.5% may be mixed. When the Al—Si layer is sandwiched between Ti and TiN, hillock resistance can be further improved. In the patterning, the aforementioned hard mask of SiON or the like is preferably employed. Note that the material and the forming method of the wirings are not limited to these, and the aforementioned material for forming the gate electrode may be employed as well.

Through the aforementioned steps, a semiconductor device having TFTs is completed. The semiconductor device includes an IC tag, an IC chip, a wireless chip, and the like. Although a top gate structure is employed in this embodiment, a bottom gate structure (an inversely staggered structure) may be employed as well. A region where a thin film active element such as a TFT is not formed mainly includes a base insulating film material, an interlayer insulating film material and a wiring material. This region preferably occupies 50% or more, and more preferably 70 to 95% of the whole semiconductor device. Meanwhile, it is preferable that an island shape semiconductor region (island) of the active element including the TFT portion occupy 1 to 30%, and more preferably 5 to 15% of the whole semiconductor device. As shown in FIG. 6D, the thickness of the protective film or the interlayer film in the semiconductor device is desirably controlled so that the distance ($t_{over}$) between the an semiconductor layer of the TFT and the lower protective film may be the same or substantially the same as the distance ($t_{over}$) between the semiconductor layer and the upper interlayer film (or protective film if formed). By disposing the semiconductor layer in the middle of the semiconductor device in this manner, stress applied to the semiconductor layer can be alleviated, thereby generation of cracks can be prevented.

Embodiment 2

Figure 8A:
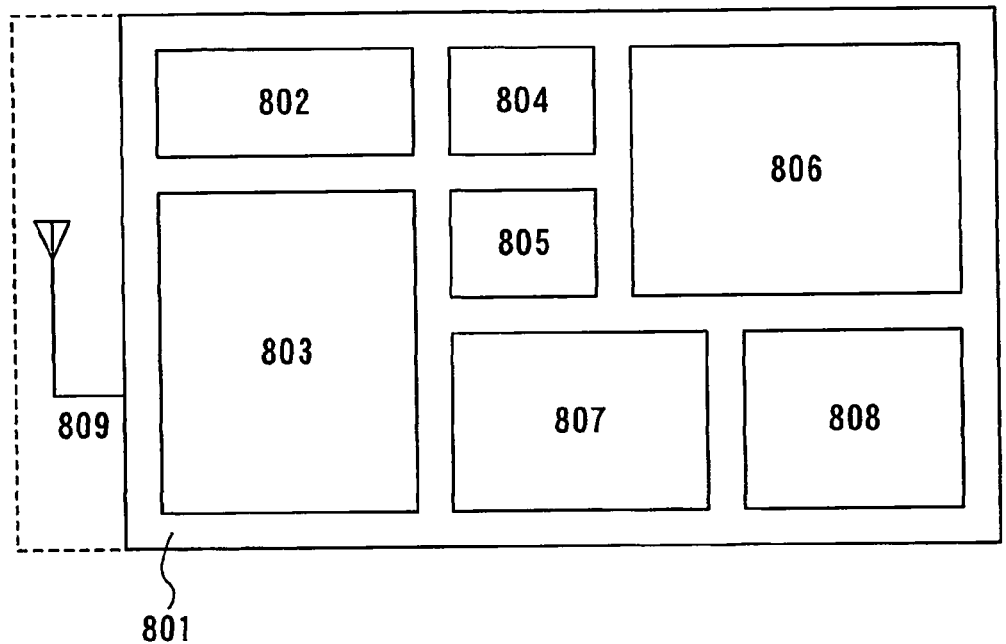
FIGS. 8A and 8B are diagrams each showing an application of a memory device of the invention.

Described in this embodiment is an example of a semiconductor device incorporating the memory device of the invention on the same substrate. An IC tag can be taken as an example of the semiconductor device where a memory and other functional circuits are integrated on the same substrate. FIG. 8A is a block diagram of an IC tag. An IC tag 801 includes an RF circuit 802, a power supply circuit 803, a command control circuit 804, a clock 805, a congestion control circuit 806, a memory control circuit 807, a memory 808, and an antenna 809. These functional circuits are formed on the same insulating substrate. Note that the antenna 809 may be formed on the same substrate or provided externally and connected to a terminal formed on the same substrate, thus the antenna 809 is surrounded by a dashed line in the drawing.

In the IC tag 801, all the circuits except for the memory 808 can be formed by the TFT manufacturing steps. When the memory device of the invention is incorporated in the memory 808, all the circuits can be formed by the same manufacturing steps. In the case where the semiconductor device is formed on one substrate as shown in this embodiment, improved productivity and cost saving can be achieved by forming all the circuits by the same manufacturing steps.

A write-once memory can be suitably applied to the IC tag because, similarly to a bar code, it is not necessary to change the data content of a memory once it is determined. The security of an IC tag that is used for individual recognition and goods management can be improved by preventing the data content from being rewritten. Further, the IC tag should hold data for a long period; therefore, a write-once memory performing an irreversible operation for writing data is suitably incorporated in the IC tag. In addition, if data should be written during the use of the IC tag, available memory can be reserved as needed. In this manner, by incorporating the memory device of the invention in the IC tag, high-security and easy-to-use product can be provided.

Figure 8B:
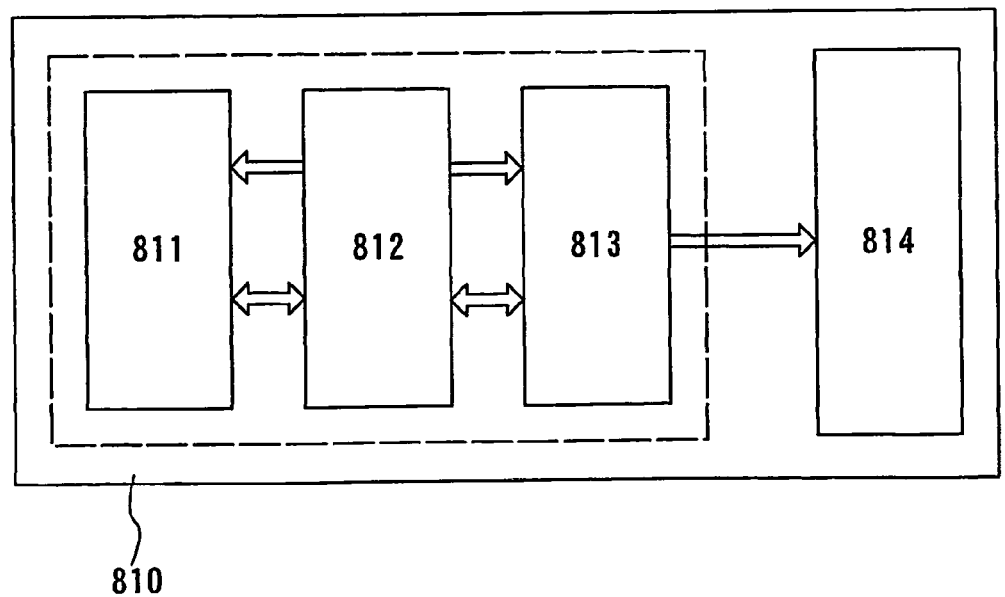

An IC tag operates with a semiconductor device formed on an insulating substrate. The memory device of the invention can be used as a part of a device. An example of this case is shown in FIG. 8B. A home electronic appliance 810, for example such as a rice cooker and an air conditioner, includes a CPU 812, a memory 811, an I/O controller 813, and an external device 814. The memory 811 incorporated in this electronic appliance is a program ROM where operating data of the appliance is written before shipment thereof.

The CPU 812, the memory 811 and the I/O controller 813 are generally formed as individual ICs; however, they can be formed on the same insulating substrate using TFTs. It is very advantageous that the circuits are formed on the same substrate even for a part of the appliance as shown in this embodiment. For example, when the CPU 812, the memory 811 and the I/O controller 813 are formed as individual ICs, they are connected to each other with external wirings. Meanwhile, when they are formed on the same substrate, external connecting wirings are no longer required, leading to significantly reduced size of the product. Further, steps and cost for connection are reduced, which results in cost saving of the product.

Since the operating data written to the memory is not required to be rewritten after shipment of the product, a write-once memory is suitably applied to the electronic appliance. In addition, the data can be written easily, therefore, the data content can be determined and written at the last stage of the manufacture of the product taking into consideration a change or update of the written data.

Embodiment 3

Figure 9A:
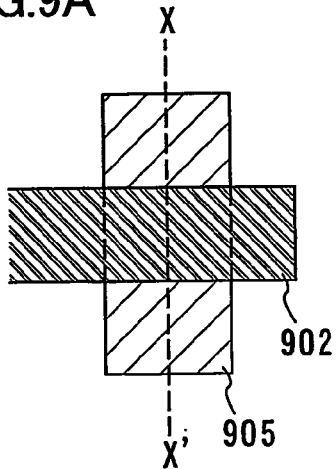
FIGS. 9A to 9E are diagrams each showing an example of a memory cell in a memory device of the invention.
Figure 9B:
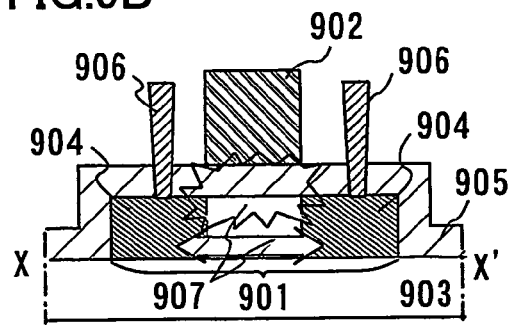
Figure 9C:
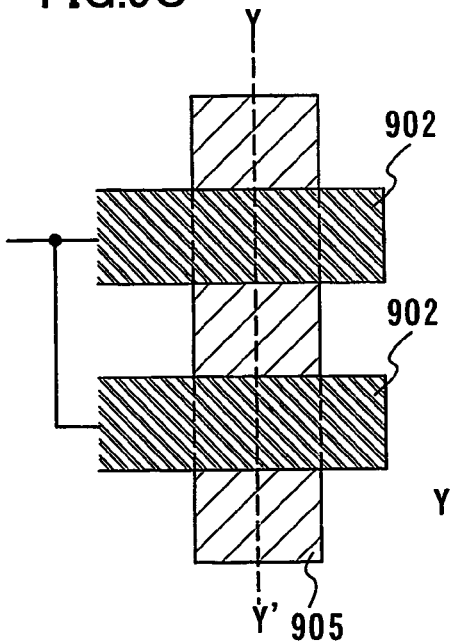
Figure 9D:
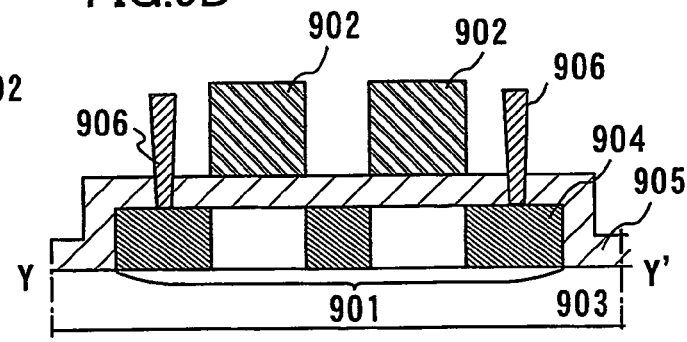
Figure 9E:
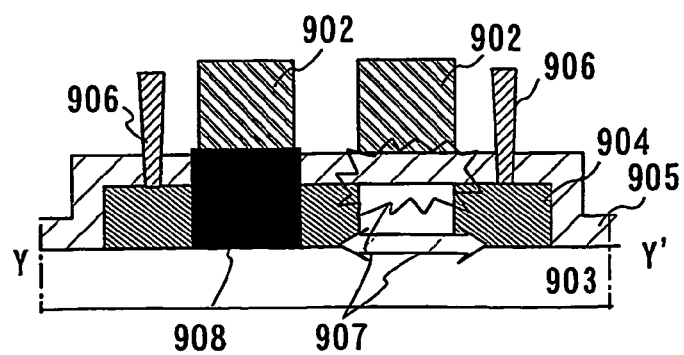

Described in this embodiment are measures for reducing writing defects of a memory cell. Description is made with reference to FIGS. 9A and 9C showing top plan views of a TFT. Description is made with reference to FIGS. 9B, 9D, and 9E showing cross sectional views of a TFT. A TFT includes a semiconductor film 901 formed over an insulating substrate 903, a gate insulating film 905 over the semiconductor film 901, and a gate electrode 902 over the gate insulating film 905. The semiconductor film 901 has high concentration impurity regions 904 to which two wirings 906 are connected respectively. The memory cell in the memory device of the invention may have a writing defect 907 as shown in FIGS. 9A and 9B. When a voltage is applied between a gate electrode and a semiconductor film, three terminals of a TFT are generally insulated from each other; however, in a defective element, the semiconductor film 901 and the gate insulating film 905 function as a resistor and the three terminals are conducted to each other.

As a measure for preventing such a defective element, it is suggested that a TFT adopt a double gate structure having two gate electrodes as shown in FIGS. 9C and 9D. A defective element is generated at random since it is supposedly caused by dust in a semiconductor film or an insulating film. Even when the defect 907 occurs in one channel region of the two gate electrodes as shown in FIG. 9E, for example, the two wirings 906 are insulated if the other channel region becomes an insulating region 908, therefore, the TFT can be used as a normal memory cell. Specifically, according to the present data, a defective element is detected about 3% of the time. Since the defective element is generated at random, if a double gate structure is adopted, the generation can be probabilistically reduced to 0.1% or less.

By applying the aforementioned measure, a TFT may have a multi-gate structure to reduce a defective element. The multi-gate here means two or more gate electrodes in a TFT. The generation of defective elements can be reduced with the increase in the number of gate electrodes in a TFT. The number of gate electrodes is desirably optimized taking into consideration current consumption or applied voltage during the use of a memory, the area of a memory cell array, and the like.

A defective element is still generated with the increase in memory capacity. In such a case, a redundant circuit can be additionally provided similarly to a memory device manufactured today. Alternatively, by controlling an external circuit, access to the defective element can be prohibited as a flash memory.

EXPLANATION OF REFERENCE

22: memory cell 24: memory cell 31: word line 32: bit line 33: selection control line 34: resistor element 35: selection transistor 42: memory cell 44: memory cell 100: TFT 101: insulating substrate 102: semiconductor film 103: high concentration impurity region 104: channel region 105: gate insulating film 106: gate electrode 107: TFT 108: insulating region 201: word line 202: bit line 203: TFT 204: source line 206: TFT 207: TFT 208: TFT 209: TFT 301: semiconductor film 302: electrode 303: insulating substrate 304: high concentration impurity region 305: insulating film 306: wiring 307: void 500: substrate 501: peeling layer 502: protective film 503: island shape semiconductor film 504: gate insulating film 505: gate electrode 506: resist 507: P-channel TFT 508: N-channel TFT 509: resist 510: impurity element 511: low concentration impurity region 512: resist 513: impurity element 514: high concentration impurity region 601: insulating film 602: resist 603: side wall 604: resist 605: impurity element 606: high concentration impurity region 607: interlayer film 608: protective film 609: wiring 701: insulating film 702: insulating film 801: IC tag 802: RF circuit 803: power supply circuit 804: command control circuit 805: clock 806: congestion control circuit 807: memory control circuit 808: memory 809: antenna 810: electronic appliance 811: memory 812: CPU 813: I/O controller 814: external device 901: semiconductor film 902: gate electrode 903: insulating substrate 904: high concentration impurity region 905: gate insulating film 906: wiring 907: defect 908: insulating region

The invention claimed is:

1. A write-once memory device comprising:
a first memory cell formed over an insulating surface, and comprising a first semiconductor film having at least two first impurity regions and a first region therebetween, a first insulating film over the first semiconductor film, a first gate electrode formed over the first region, and at least two first wirings connected to the respective first impurity regions; and
a second memory cell formed over the insulating surface, and comprising a second semiconductor film having at least two second impurity regions and a second region therebetween, a second insulating film over the second semiconductor film, a second gate electrode formed over the second region, and at least two second wirings connected to the respective second impurity regions,
wherein the first region is altered to an insulating state and the second region is maintained in an initial state when applying a gate voltage to the first gate electrode and the second gate electrode, a first voltage to at least one of the two first wirings, and a second voltage to at least one of the two second wirings, and
wherein the first voltage is lower than the second voltage.

2. The write-once memory device according to claim 1, further comprising sidewalls formed on side surfaces of the first gate electrode.

3. The write-once memory device according to claim 1, further comprising sidewalls formed on side surfaces of the second gate electrode.

4. The write-once memory device according to claim 1, further comprising sidewalls formed on side surfaces of each of the first gate electrode and the second gate electrode.

5. A write-once memory device comprising:
a first memory cell formed over an insulating surface, and comprising a first semiconductor film comprising at least three first impurity regions, a first region, and a second region, a first insulating film over the first semiconductor film, a first gate electrode formed over the first region, a second gate electrode formed over the second region, and at least two first wirings connected to the respective first impurity regions, and
a second memory cell formed over the insulating surface, and comprising a second semiconductor film comprising at least three second impurity regions, a third region, and a fourth region, a second insulating film over the second semiconductor film, a third gate electrode formed over the third region, a fourth gate electrode formed over the fourth region, and at least two second wirings connected to the respective second impurity regions,
wherein the first region is altered to an insulating state and the third region is maintained in an initial state when applying a gate voltage to the first gate electrode and the third gate electrode, a first voltage to at least one of the two first wirings, and a second voltage to at least one of the two second wirings,
wherein the first voltage is lower than the second voltage,
wherein each of the first region and the second region is formed between the first impurity regions, and
wherein each of the third region and the fourth region is formed between the second impurity regions.

6. The write-once memory device according to claim 5, further comprising sidewalls formed on side surfaces of the first gate electrode.

7. The write-once memory device according to claim 5, further comprising sidewalls formed on side surfaces of the second gate electrode.

8. The write-once memory device according to claim 5, further comprising sidewalls formed on side surfaces of each of the first gate electrode and the second gate electrode.

9. The write-once memory device according to claim 5, further comprising sidewalls formed on side surfaces of the third gate electrode.

10. The write-once memory device according to claim 5, further comprising sidewalls formed on side surfaces of the fourth gate electrode.

11. The write-once memory device according to claim 5, further comprising sidewalls formed on side surfaces of each of the third gate electrode and the fourth gate electrode.

12. The write-once memory device according to claim 5, further comprising sidewalls formed on side surfaces of each of the first gate electrode, the second gate electrode, the third gate electrode, and the fourth gate electrode.

* * * * *